(12) United States Patent
Long

(10) Patent No.: US 9,904,401 B2
(45) Date of Patent: Feb. 27, 2018

(54) TOUCH PANEL AND TOUCH DISPLAY APPARATUS

(71) Applicants: Boe Technology Group Co., Ltd., Beijing (CN); Chengdu Boe Optoelectronics Technology Co., Ltd., Chengdu (CN)

(72) Inventor: Qingde Long, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 87 days.

(21) Appl. No.: 14/652,427

(22) PCT Filed: Sep. 16, 2014

(86) PCT No.: PCT/CN2014/086625
§ 371 (c)(1),
(2) Date: Jun. 15, 2015

(87) PCT Pub. No.: WO2015/184702
PCT Pub. Date: Dec. 10, 2015

(65) Prior Publication Data
US 2016/0283012 A1    Sep. 29, 2016

(30) Foreign Application Priority Data

Jun. 5, 2014    (CN) .......................... 2014 1 0247085

(51) Int. Cl.
*G06F 3/041* (2006.01)
*G06F 3/044* (2006.01)
(Continued)

(52) U.S. Cl.
CPC ............ *G06F 3/0416* (2013.01); *G06F 3/044* (2013.01); *G06F 3/0412* (2013.01);
(Continued)

(58) Field of Classification Search
CPC . G06F 2203/04107; G06F 2203/04112; G06F 3/0412; G06F 3/0416; G06F 3/0421; G06F 3/044; H01L 27/142
See application file for complete search history.

(56) References Cited

U.S. PATENT DOCUMENTS 8,384,690 B2 *   2/2013   Anderson ............... G06F 3/041
                                                                136/244
8,730,179 B2 *   5/2014   Rosenblatt .................... 136/206
(Continued)

FOREIGN PATENT DOCUMENTS

CN    201285541    8/2009
CN    201467201    5/2010
(Continued)

OTHER PUBLICATIONS

Office action from Chinese Application No. 201410247085.3 dated Jul. 1, 2016.
(Continued)

*Primary Examiner* — Dmitriy Bolotin
(74) *Attorney, Agent, or Firm* — Calfee, Halter & Griswold LLP

(57) ABSTRACT

The present disclosure relates to a touch panel and a touch display apparatus. The touch panel comprises a glass substrate, a solar cell panel located at a side of the glass substrate and comprising a plurality of solar cell modules, n sensing lines in a first direction and m sensing lines in a second direction for carrying the electric power converted by the solar cell panel, and a detection unit for detecting the electric currents or voltages on the sensing lines in the first (Continued)

direction and the sensing lines in the second direction and for determining a touch region of a touch object based on a variation in the electric currents or voltages, wherein each of the n sensing lines in the first direction and the m sensing lines in the second direction connects the individual solar cell modules in the respective direction in series, and m and n are positive integers. The number of the wires connected in the touch panel of the present disclosure is reduced, and a lightweight touch screen is achieved.

17 Claims, 5 Drawing Sheets

(51) Int. Cl.
*H01L 27/142* (2014.01)
*G06F 3/042* (2006.01)

(52) U.S. Cl.
CPC .......... *G06F 3/0421* (2013.01); *H01L 27/142* (2013.01); *G06F 2203/04107* (2013.01); *G06F 2203/04112* (2013.01)

(56) References Cited

U.S. PATENT DOCUMENTS

| | | | |
|---|---|---|---|
| 2010/0078230 | A1 | 4/2010 | Rosenblatt et al. |
| 2010/0079387 | A1 | 4/2010 | Rosenblatt et al. |
| 2012/0086663 | A1* | 4/2012 | Matsuo ............... G06F 3/04883 345/173 |
| 2013/0147764 | A1 | 6/2013 | Chaji et al. |
| 2013/0157561 | A1* | 6/2013 | Tamai .................... H04M 1/67 455/26.1 |

FOREIGN PATENT DOCUMENTS

| | | |
|---|---|---|
| CN | 102331821 | 1/2012 |
| CN | 102508577 | 6/2012 |
| CN | 103092453 | 5/2013 |
| CN | 203117950 | 8/2013 |
| WO | 2010/039498 | 4/2010 |

OTHER PUBLICATIONS

International Search Report and Written Opinion from PCT/CN14/086625 dated Mar. 6, 2015.

* cited by examiner

TOUCH PANEL AND TOUCH DISPLAY APPARATUS

The present application is the U.S. national phase entry of PCT/CN2014/086625, with an international filing date of Sep. 16, 2014, which claims the benefit of Chinese Patent Application No. 201410247085.3, filed Jun. 5, 2014, the entire disclosures of which are incorporated herein by reference.

FIELD OF THE DISCLOSURE

The present disclosure relates to the field of touch technologies, and particularly to a touch panel and a touch display apparatus.

BACKGROUND OF THE DISCLOSURE

A touch screen is an input device that allows for inputting of a user's instructions by the user directly clicking the icons displayed on the screen of an image display with his/her finger or an object. When touched by the user with his/her finger or the object, the touch screen detects the touch points and drives the liquid crystal display according to the command corresponding to the clicked icon to achieve a specific display.

Depending upon their implementation principles, the existing touch screens are mainly of either capacitive types or electromagnetic types. The capacitive touch screen recognizes a touch operation via the received touch signals (i.e., electrical signals), and the electromagnetic touch screen recognizes a touch operation via the received touch signals (i.e., electromagnetic signals). Among the capacitive touch screens, taking the self-capacitance touch screen as an example, detection of a position touched by a finger is achieved based on the principle of the self-capacitance, which can be specified as follows: with a plurality of self-capacitance electrodes arranged in the same layer and independent from each other in a touch screen, when the screen is not touched by the human body, the individual self-capacitance electrodes subject to a fixed capacitance, and when the screen is touched by the human body, the self-capacitance electrodes corresponding to the touch position subject to a fixed capacitance plus the capacitance of the human body; thus, the touch position can be determined by a touch detection chip detecting the variation in the capacitance value of the individual self-capacitance electrodes during the touch period of time. In a specific implementation, the number of the self-capacitance electrodes is simply huge. Assuming that each self-capacitance electrode occupies an area of 5 mm*5 mm, by way of example, then 264 self-capacitance electrodes are needed in a liquid crystal display of 5-inch. With the self-capacitance electrodes designed to be even smaller, more of them will be needed, resulting in a great number of wires connected to the self-capacitance electrodes.

Therefore, existence of numerous electrodes and wires in the prior art touch screen leads to a complicated apparatus.

SUMMARY OF THE DISCLOSURE

According to a first aspect of the disclosure, provided is a touch panel comprising a glass substrate, a solar cell panel located at a side of the glass substrate and comprising a plurality of solar cell modules, n sensing lines in a first direction and m sensing lines in a second direction for carrying the electric power converted by the solar cell panel, and a detection unit for detecting the electric currents or voltages on the sensing lines in the first direction and the sensing lines in the second direction and for determining a touch region of a touch object based on a variation in the electric currents or voltages, wherein each of the n sensing lines in the first direction and the m sensing lines in the second direction connects the individual solar cell modules in the respective direction in series, and m and n are positive integers.

According to a second aspect of the disclosure, provided is a touch display apparatus comprising a display panel and the touch panel as described in the first aspect of the disclosure, wherein the touch panel is located right above a display pixel region of the display panel, and the plurality of solar cell modules in the touch panel are projected orthographically onto the pixel electrodes of the display panel.

According to a third aspect of the disclosure, provided is a touch display apparatus comprising a display panel and the touch panel as described in the first aspect of the disclosure, wherein the touch panel is located above a backlight of the display panel, and the pixel electrodes of the display panel are projected orthographically onto the solar cell panel of the touch panel.

According to a fourth aspect of the disclosure, provided is a touch display apparatus comprising a display panel, a processor and the touch panel as described in the first aspect of the disclosure, wherein the display panel is separated from the touch panel, and the processor pre-stores a correspondence between a display region of the display panel and a touch region of the touch panel.

According to a fifth aspect of the disclosure, provided is a touch display apparatus comprising a display panel that comprises an upper glass substrate, pixel electrodes, a lower glass substrate and a backlight and a touch panel that comprises a solar cell panel located above the backlight of the display panel and comprising a plurality of solar cell modules, n sensing lines in a first direction and m sensing lines in a second direction for carrying the electric power converted by the solar cell panel, and a detection unit for detecting the electric currents or voltages on the sensing lines in the first direction and the sensing lines in the second direction and for determining a touch region of a touch object based on a variation in the electric currents or voltages, wherein each of the n sensing lines in the first direction and the m sensing lines in the second direction connects the individual solar cell modules in the respective direction in series, and m and n are positive integers, and wherein the pixel electrodes of the display panel are projected orthographically onto the solar cell panel of the touch panel.

The present disclosure utilizes the sensing lines in a first direction and the sensing lines in a second direction that connect the solar cell modules in series to position the touch object by touch sensing, without the need of introduction of other touch sensing means (e.g., self-capacitance electrodes). Thus, the number of the wires connected is reduced, which achieves a reduction of the complexity of the touch screen apparatus and hence a lightweight implementation of a touch screen.

DETAILED DESCRIPTION OF THE EMBODIMENTS

The embodiments of the disclosure are based on the principle as follows: in a touch operation, the touch panel is shielded by the touch object at the contact position (i.e. the touch region) on the touch panel, resulting in a variation in the electric power outputted by the solar cell modules at a corresponding position in the touch panel, and the touch region of the touch object can be determined by detecting such positions to which the solar cell modules correspond.

The embodiments are described in detail below with reference to the accompanying drawings.

Figure 1:
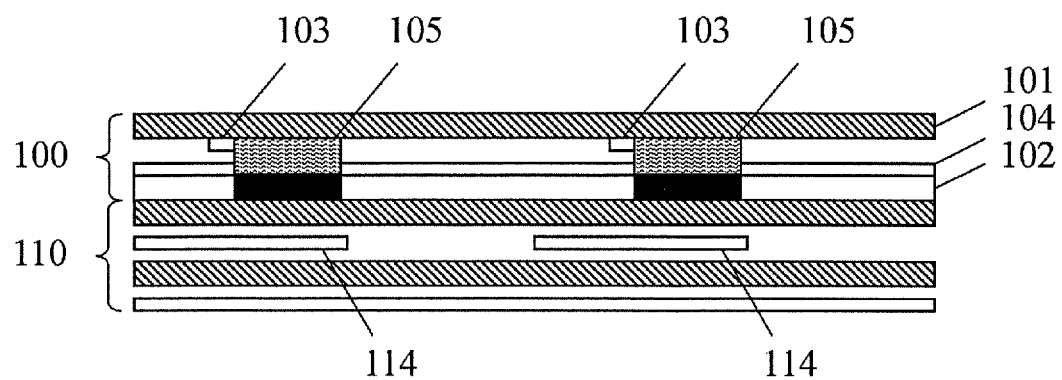
FIG. 1 is a side view of a touch panel according to an embodiment of the disclosure.

FIG. 1 is a side view of a touch panel 100 according to an embodiment of the disclosure. As shown in FIG. 1, the touch panel 100 may comprise a glass substrate 101, a solar cell panel 102, n sensing lines in a first direction 103 and m sensing lines in a second direction 104, and a detection unit (not shown). m and n are positive integers.

The solar cell panel 102 is located at a side of the glass substrate 101, and may comprise a plurality of solar cell modules 105. The sensing lines in the first direction 103 and the sensing lines in the second lines 104 connect the plurality of solar cell modules 105 in the respective direction in series and carry the electric power converted by the solar cell panel 102. Upon a contact of the touch object with the glass substrate 101, the electric currents or voltages on the sensing lines in the first direction 103 and the sensing lines in the second direction 104 are detected by the detection unit, and the touch region of the touch object is determined based on a variation in the detected electric currents or voltages.

Specifically, the solar cell modules 105 are arranged with their photosurfaces facing upwards to receive the light transmitted through the glass substrate 101. When operating on the touch panel, the touch object shields a portion of the region of the touch panel 100, which consequently causes a variation in the output of the solar cell modules 105 within the shielded region. In particular, the shielding effect on the touch panel 100 is most significant at the position where the touch object is in contact with the touch panel, and hence the variation in the output of those solar cell modules 105 corresponding to the contact position is most significant. By detecting the electric currents or voltages on the sensing lines in the first direction 103 and the sensing lines in the second direction 104 that connect the solar cell modules 105 in series, the detection unit may determine on which sensing lines the electric currents or voltages vary most significantly, thereby recognizing a region encompassed by these sensing lines as the touch region. It should be understood that the so called "sensing lines" here may be normal wires, that is, wires themselves having no "sensing" functions, but only used to output the electric current or voltage signals from the solar cell modules 105.

Furthermore, a display panel 110 is also shown in FIG. 1 with which the touch panel 100 is overlapped, both of them forming a touch display apparatus (discussed below). It should be noted that in order not to impede the display function of the display panel 110, the plurality of solar cell modules 105 in the touch panel 100 may not cover the full region of the solar cell panel 102, but rather may be arranged in a mesh shape at the positions corresponding to the opaque regions of the individual pixel electrodes 114 of the display panel 110, thereby ensuring a certain transmittance of the whole solar cell panel 102. Optionally, each of the solar cell modules 105 may correspond to at least one pixel electrode 114 in the display panel 110, and each pixel electrode corresponds to only one solar cell module 105. In this way, the number of the first sensing lines and the second sensing lines can be further reduced with a certain touching accuracy guaranteed.

It should be noted that the internal structure of the touch panel 100 as shown in FIG. 1 is only exemplary. By way of example, the solar cell panel 102 may also be stuck to the glass substrate 101 with the solar cell modules 105 arranged at the lower surface of the solar cell panel 102, but the solar cell modules 105 should still be arranged with their photosurfaces facing upwards.

Figure 2:
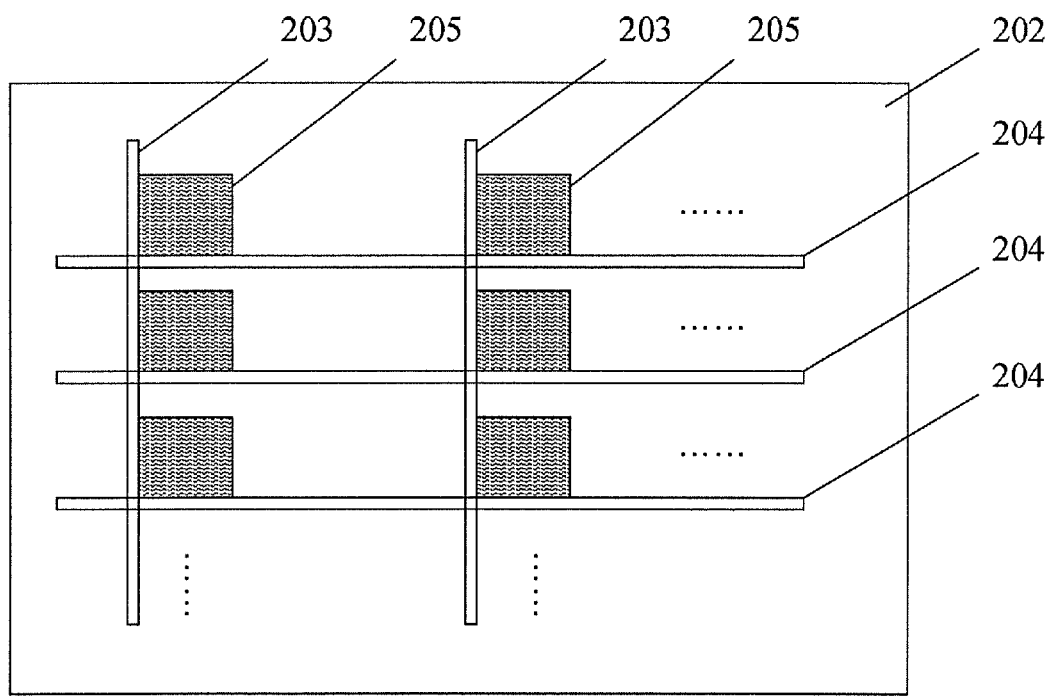
FIG. 2 is a schematic diagram of connecting the solar cell modules in series utilizing lateral sensing lines and longitudinal sensing lines according to an embodiment of the disclosure.

FIG. 2 is a schematic diagram of connecting the solar cell modules in series utilizing lateral sensing lines and longitudinal sensing lines according to an embodiment of the disclosure. The plurality of solar cell modules 205 on the solar cell panel 202 are connected in series by the lateral sensing lines 204 and the longitudinal sensing lines 203, wherein the electric power converted by each solar cell module 205 is transmitted via both the lateral sensing lines 204 and the longitudinal sensing lines 203. However, in other embodiments, the sensing lines in the first direction and the sensing lines in the second direction may also be arranged to intersect at other angles.

In practical use, the light impinging onto the touch panel typically comes from two kinds of light sources: an external light source and an internal light source. The external light source refers to the ambient light source in the space where the touch panel (or the touch display apparatus) is located, e.g. a lamp in a room or the sunlight outdoors, etc. The internal light source refers typically to the backlight of the display panel with which the touch panel is overlapped and used, but the embodiments of the disclosure are not limited to this. For example, a dedicated internal light source may be set up for the touch panel.

Whatever the case, it is needed for the touch panel to determine whether the external light source or the internal light source is to be used as its working light source. Since the external light source generally provides a higher illumination level than the internal light source does, and it is further noted that in the previous embodiment the solar cell modules are arranged with their photosurfaces facing upwards, and that the internal light source (e.g. the backlight of the display panel) is typically arranged below the solar cell panel, the external light source often prevails in terms of the photoelectric conversion efficiency of the solar cell modules. Based on this, a determination can be made according to the overall illumination level, i.e. whether the external light source or the internal light source is determined to be used as the working light source is based on whether the sum of the electric currents or voltages on the sensing lines in the first direction and the sensing lines in the second direction is greater than a predetermined threshold. For example, if the sum of the electric currents on the sensing lines in the first direction and the sensing lines in the second direction is greater the predetermined threshold, it indicates that the overall illumination level provided by both the external light source and the internal light source is very high, whereby it is inferred that the light provided by the external light source is sufficient, and thus the external light source may be determined as the working light source; otherwise, the internal light source may be determined as the working light source. It should be understood that when the illumination level of the external light source is too low (e.g. in complete darkness), it makes sense to use the internal light source as the working light source.

Further, taking into account the transition of the usage scenario (e.g., in using the touch panel, a user moves from a location where the light is sufficient to a location with a poor visibility, or the ambient light source is lighted on or switched off at the same location where the touch panel is used; or the internal light source is lighted on or switched off during use, etc.), to achieve a more accurate determination, different thresholds may be set for different cases where the internal light source is either lighted on or switched off.

In the case that the internal light source is not lighted on, if the sum of the electric currents on the sensing lines in the first direction and the sensing lines in the second direction is determined to be greater than a first electric current threshold, the external light source is determined as the working light source, and if the sum of the electric currents on the sensing lines in the first direction and the sensing lines in the second direction is determined to be not greater than the first electric current threshold, the internal light source is determined as the working light source; or, if the sum of the voltages on the sensing lines in the first direction and the sensing lines in the second direction is determined to be greater than a first voltage threshold, the external light source is determined as the working light source, and if the sum of the voltages on the sensing lines in the first direction and the sensing lines in the second direction is determined to be not greater than the first voltage threshold, the internal light source is determined as the working light source.

In the case that the internal light source is lighted on, if the sum of the electric currents on the sensing lines in the first direction and the sensing lines in the second direction is determined to be greater than a second electric current threshold, the external light source is determined as the working light source, and if the sum of the electric currents on the sensing lines in the first direction and the sensing lines in the second direction is determined to be not greater than the second electric current threshold, the internal light source is determined as the working light source; or, if the sum of the voltages on the sensing lines in the first direction and the sensing lines in the second direction is determined to be greater than a second voltage threshold, the external light source is determined as the working light source, and if the sum of the voltages on the sensing lines in the first direction and the sensing lines in the second direction is determined to be not greater than the second voltage threshold, the internal light source is determined as the working light source.

Obviously, in the case that the internal light source is lighted on, since the internal light source provides a basic illumination level, the second threshold should be greater than the first threshold. In addition, the above determinations are preferably performed when the touch object is not in contact with the touch panel, so as to avoid the effect of the touch object in a touch operation on the illumination level.

In general, if the external light source is used as the working light source, the ambient light would be shielded by the touch object from being incident on the touch panel when the touch object is in contact with the touch panel, wherein the position where the touch object is in contact with the touch panel would be completely shielded from the ambient light. Thus, the solar cell modules corresponding to the contact position are of a minimized photoelectric conversion efficiency. If the internal light source is used as the working light source, the light that is emitted from the internal light source would be reflected by the touch object when the touch object is in contact with the touch panel, wherein the reflected light is the strongest in intensity at the position where the touch object is in contact with the touch panel. Thus, the solar cell modules corresponding to the contact position are of a maximized photoelectric conversion efficiency. In view of this, the touch region can be positioned based on the different variations in the electric currents or voltages that are outputted from the sensing lines in the first direction and the sensing lines in the second direction for different cases where either the external light source or the internal light source is used as the working light source.

Specifically, if the external light source is determined by the detection unit as the working light source, then upon a contact of the touch object with the touch panel, the detection unit determines at least one sensing line having a smaller electric current among the sensing lines in the first direction and at least one sensing line having a smaller electric current among the sensing lines in the second direction, and recognizes the region that is encompassed by the determined sensing lines having smaller electric currents in both directions as the touch region of the touch object; or, it determines at least one sensing line having a smaller voltage among the sensing lines in the first direction and at least one sensing line having a smaller voltage among the sensing lines in the second direction, and recognizes the region that is encompassed by the determined sensing lines having smaller voltages in both directions as the touch region of the touch object.

Figure 3:
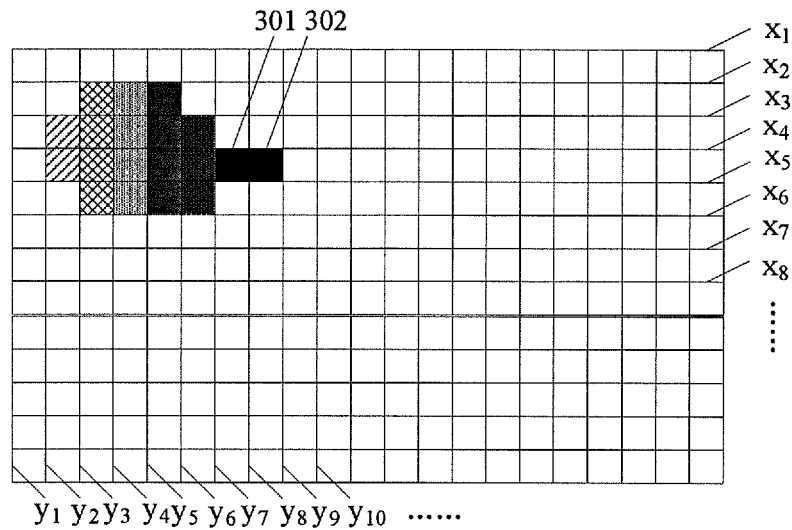
FIG. 3 is a schematic diagram of determining a touch region when using an external light source as the working light source according to an embodiment of the disclosure.

FIG. 3 is a schematic diagram of determining a touch region when using an external light source as the working light source according to an embodiment of the disclosure, wherein the sensing lines in the first direction are the lateral sensing lines and the sensing lines in the second direction are the longitudinal sensing lines, by way of example. Upon a contact of the touch object with the touch panel, the electric currents on $x_2$~$x_6$ of the lateral sensing lines vary, wherein the electric currents on the lateral sensing lines $x_4$ and $x_5$ are relatively small, and the electric currents on $y_2$~$y_9$ of the longitudinal sensing lines also vary, wherein the electric currents on the longitudinal sensing lines $y_7$, $y_8$ and $y_9$ are relatively small. Thus, the regions 301 and 302, which are encompassed by the lateral sensing lines $x_4$ and $x_5$ and the longitudinal sensing lines $y_7$, $y_8$ and $y_9$, are determined as the touch region of the touch object on the touch panel.

Otherwise, if the internal light source is determined by the detection unit as the working light source, then upon a contact of the touch object with the touch panel, the detection unit determines at least one sensing line having a larger electric current among the sensing lines in the first direction and at least one sensing line having a larger electric current among the sensing lines in the second direction, and recognizes the region that is encompassed by the determined sensing lines having larger electric currents in both directions as the touch region of the touch object; or, it determines at least one sensing line having a larger voltage among the sensing lines in the first direction and at least one sensing line having a larger voltage among the sensing lines in the second direction, and recognizes the region that is encompassed by the determined sensing lines having larger voltages in both directions as the touch region of the touch object.

Figure 4:
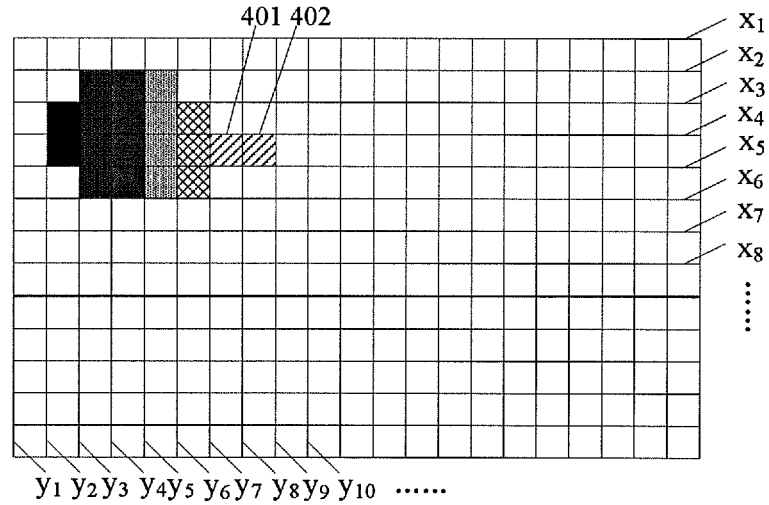
FIG. 4 is a schematic diagram of determining a touch region when using an internal light source as the working light source according to an embodiment of the disclosure.

FIG. 4 is a schematic diagram of determining a touch region when using an internal light source as the working light source according to an embodiment of the disclosure, wherein the sensing lines in the first direction are the lateral sensing lines and the sensing lines in the second direction are the longitudinal sensing lines, by way of example. Upon a contact of the touch object with the touch panel, the electric currents on $x_2 \sim x_6$ of the lateral sensing lines vary, wherein the electric currents on the lateral sensing lines $x_4$ and $x_5$ are relatively large, and the electric currents on $y_2 \sim y_9$ of the longitudinal sensing lines also vary, wherein the electric currents on the longitudinal sensing lines $y_7$, $y_8$ and $y_9$ are relatively large. Thus, the regions 401 and 402, which are encompassed by the lateral sensing lines $x_4$ and $x_5$ and the longitudinal sensing lines $y_7$, $y_8$ and $y_9$, are determined as the touch region of the touch object on the touch panel.

In one embodiment, an absolute criterion may be employed in determining on which sensing lines the electric currents or voltages are smaller or larger, e.g. by judging whether the electric current or voltage is smaller or larger than a respective predetermined threshold.

In another embodiment, a relative criterion may be employed in determining on which sensing lines the electric currents or voltages are smaller or larger, e.g. by judging whether the magnitude of the variation in the electric current or voltage is smaller or larger than a respective predetermined threshold. For example, if the magnitude of a decrease in the electric current or voltage is greater than a predetermined threshold, the electric current or voltage is determined as being smaller; if the magnitude of a increase in the electric current or voltage is greater than a predetermined threshold, the electric current or voltage is determined as being larger.

In addition, it should be understood that in the case of the number of the determined sensing lines in the first direction and/or the second direction being one (i.e. there being no region that is "encompassed" by the sensing lines in both directions), the region corresponding to the solar cell modules that are connected in series by the sensing line(s) in the first direction and the sensing line(s) in the second direction together can be recognized as the touch region.

The operating principle of a touch display apparatus that is formed by a touch panel according to an embodiment of the disclosure together with a display panel is further explained below with reference to the accompanying drawings.

Figure 5:
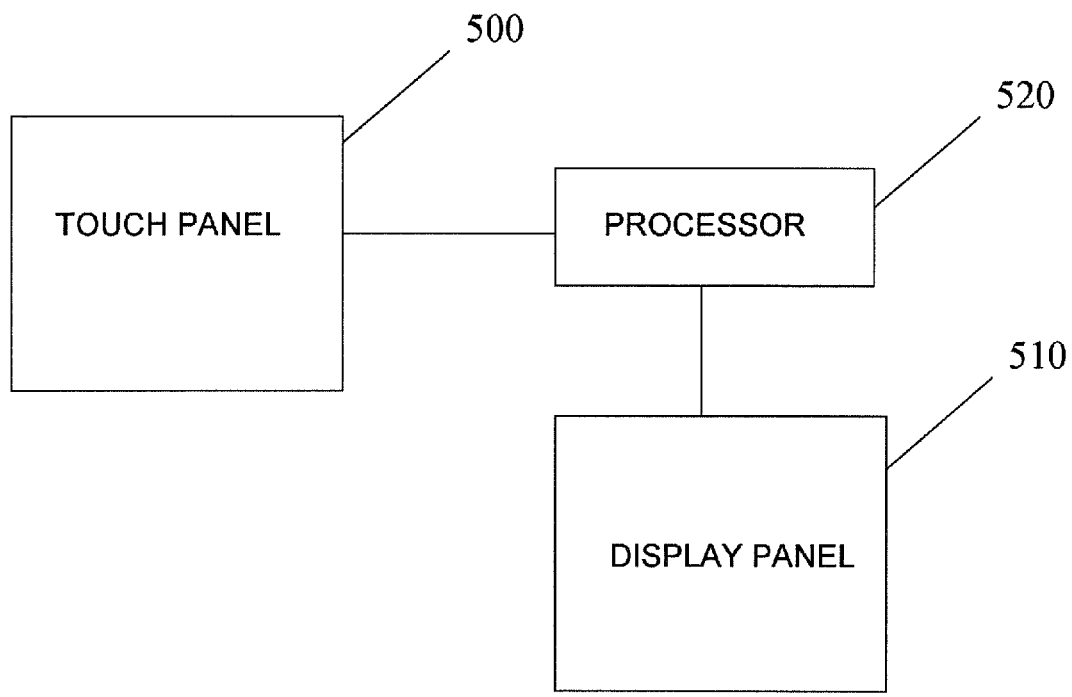
FIG. 5 is a schematic block diagram of a touch display apparatus according to an embodiment of the disclosure.

FIG. 5 is a schematic block diagram of a touch display apparatus according to an embodiment of the disclosure. As is shown in FIG. 5, the touch display apparatus may comprise a display panel 510, a touch panel 500 and a processor 520.

Figure 6:
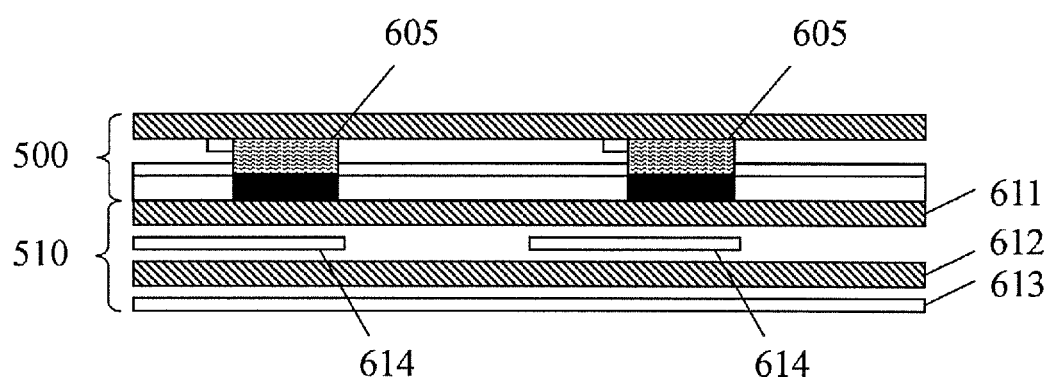
FIG. 6 is a structural schematic diagram of a touch display apparatus according to an embodiment of the disclosure.

FIG. 6 is a structural schematic diagram of a touch display apparatus according to an embodiment of the disclosure. The touch panel 500 may be located at the outer side of a display pixel region of the display panel 510 that is used to display images, and a plurality of solar cell modules 605 in the touch panel 500 may be projected orthographically onto the display panel 510 in a mesh shape. Optionally, the projection of each solar cell module 605 may correspond to at least one pixel electrode 614 in the display panel 510, and each pixel electrode 614 corresponds to the projection of only one solar cell module 605. In addition, the display panel 510 may comprise an upper glass substrate 611, a lower glass substrate 612, pixel electrodes 614 located at the lower glass substrate 612, a common electrode and a color filter layer (not shown) that are located on the pixel region, and a backlight 613 located below the lower glass substrate 612.

Figure 7:
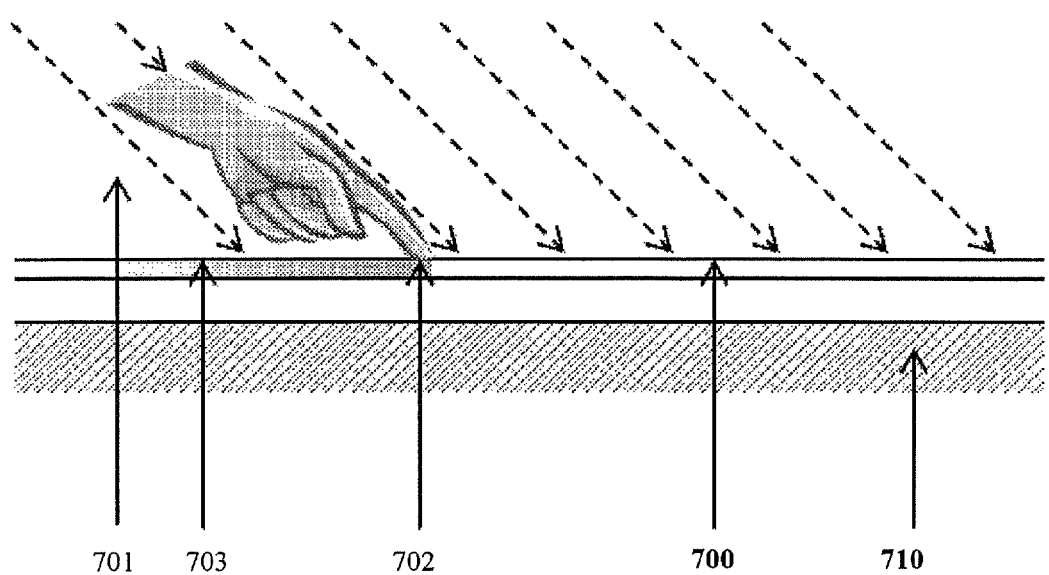
FIG. 7 is a schematic diagram of determining a touch region based on incident light from an external light source according to an embodiment of the disclosure.

FIG. 7 is a schematic diagram of determining a touch region based on incident light from an external light source according to an embodiment of the disclosure. When the touch object (i.e. the "hand" as shown in the figure) is in contact with the touch panel 700, the ambient light 701 is shielded by the touch object from being incident on the touch panel 700, wherein the ambient light at the position 702 (i.e. the touch region) where the touch object is in contact with the touch panel 700 is completely shielded, and the ambient light at the position 703 where the remaining part of the touch object is projected onto the touch panel 700 is partially shielded. Thus, the photoelectric conversion efficiency of the solar cell modules corresponding to the touch region decreases most significantly, resulting in relatively small electric currents or voltages on the corresponding sensing lines in the first direction and the second direction. The processor determines a corresponding display region on the display panel 710 according to the touch region of the touch panel, and determines a control command corresponding to the display region so as to perform a corresponding operation according to the control command.

Figure 8:
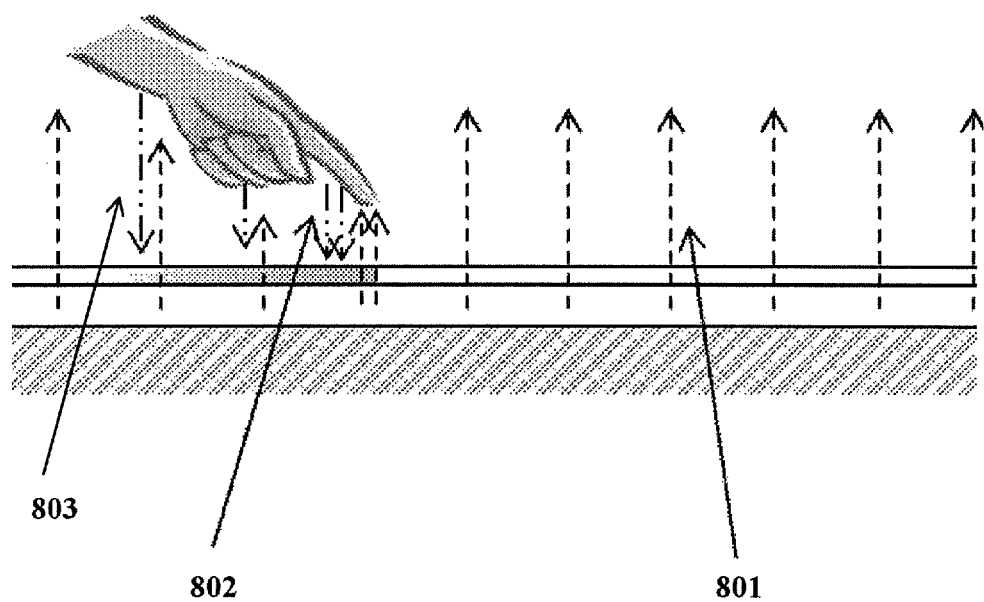
FIG. 8 is a schematic diagram of determining a touch region based on reflected light from an internal light source according to an embodiment of the disclosure.

FIG. 8 is a schematic diagram of determining a touch region based on reflected light from an internal light source (e.g. a backlight of a display panel) according to an embodiment of the disclosure. Upon a contact of the touch object (i.e. the "hand" as shown in the figure) with the touch panel, the light 801 that is emitted from the backlight of the display panel is reflected back to the touch panel, wherein the reflected light at the position 802 (i.e. the touch region) where the touch object is in contact with the touch panel is the strongest in intensity, followed by the reflected light at the position 803 where the remaining part of the touch object is projected onto the touch panel. Thus, the photoelectric conversion efficiency of the solar cell modules corresponding to the touch region increases most significantly, resulting in relatively large electric currents or voltages on the corresponding sensing lines in the first direction and the second direction. The processor determines a corresponding display region on the display panel according to the touch region of the touch panel, and determines a control command corresponding to the display region so as to perform a corresponding operation according to the control command.

Figure 9:
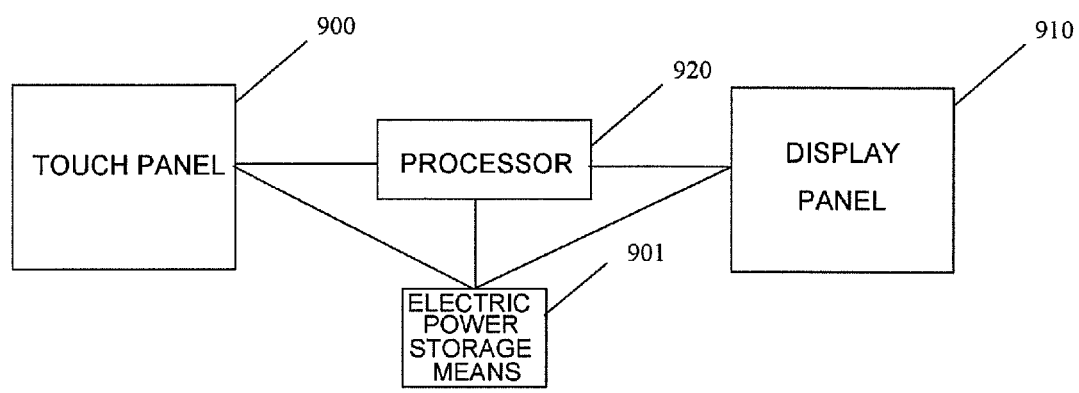
FIG. 9 is a schematic block diagram of a touch display apparatus that comprises an electric power storage means according to an embodiment of the disclosure.

FIG. 9 is a schematic block diagram of a touch display apparatus according to another embodiment of the disclosure. The touch display apparatus may comprise an electric power storage means for storing electric power. The generated electric power can be transmitted to the electric power storage means 901 by the touch panel 900 via the sensing lines in the first direction and the sensing lines in the second direction. When the touch panel 900 detects that the electric power storage means 901 is in a full state, it may supply the generated electric power directly to the display panel 910. Thus, in this embodiment, not only is the structure of the touch panel simplified, but also the electric power can be provided for the touch display apparatus, thereby prolonging the battery life of the touch display apparatus.

Figure 10:
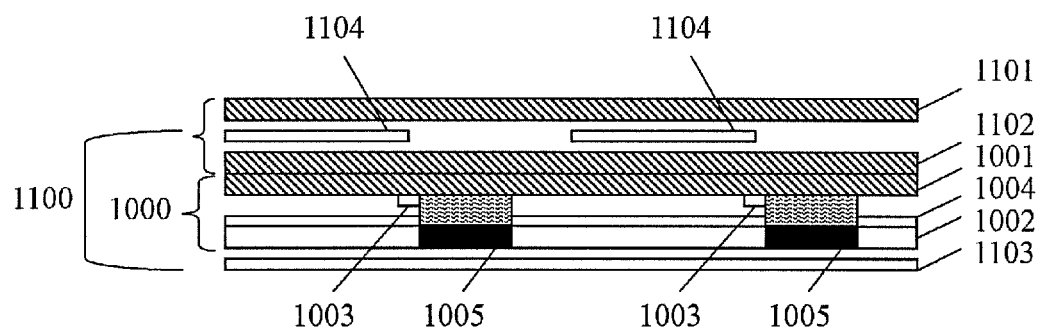
FIG. 10 is a structural schematic diagram of another touch display apparatus according to an embodiment of the disclosure.

FIG. 10 is a structural schematic diagram of a touch display apparatus according to another embodiment of the disclosure. The touch display apparatus may comprise a display panel 1100, a processor (not shown) and a touch panel 1000.

The touch panel 1000 may be of the same structure as in the previous embodiments. As is shown in the figure, the touch panel 1000 may comprise a glass substrate 1001, a solar cell panel 1002, n sensing lines 1003 in a first direction and m sensing lines 1004 in a second direction, and a detection unit (not shown). m and n are positive integers.

The display panel 1100 may comprise a backlight 1103, a lower glass substrate 1102, pixel electrodes 1104 formed on the lower glass substrate 1102, a common electrode and a color filter layer (not shown) that are formed on the pixel region and an upper glass substrate 1101 formed on the common electrode and the color filter layer.

This embodiment differs from the previous embodiments in that the touch panel 1000 is formed between the backlight 1103 and the lower glass substrate 1102 of the display panel 1100.

Specifically, the pixel electrodes 1104 of the display panel 1100 are projected onto the solar cell panel 1002 of the touch panel 1000. Optionally, each of the solar cell modules 1005 may correspond to the projection of at least one pixel electrode 1104 in the display panel 1100, and the projection of each pixel electrode 1104 corresponds to only one solar cell module 1005. The solar cell modules 1005 are arranged with their photosurfaces facing upwards, so as to receive the light that is transmitted through the display panel construction above and the own glass substrate 1001 of the touch panel, such as the light that is emitted from the external light source or the light from the internal light source that is reflected by the touch object.

In this embodiment, since the touch panel 1000 is arranged below the pixel region of the display panel 1100, the display function of the display panel 1100 is less affected by the solar cell panel 1002 in the touch panel 1000, compared to the previous embodiments. To enable the solar cell modules 1005 on the solar cell panel 1002 to receive the incident light from the external light source or the light from the internal light source that is reflected by the touch object, the plurality of solar cell modules 1005 can be arranged in a mesh shape at the positions corresponding to the non-opaque regions of individual pixel electrodes 1104 of the display panel 1100, as is shown in FIG. 10.

Similar to the previous embodiments, the internal structure of the touch panel 1000 as shown in FIG. 10 is only exemplary. By way of example, the solar cell panel 1002 may also be stuck to the glass substrate 1001 with the solar cell modules 1005 arranged at the lower surface of the solar cell panel 1002, but the solar cell modules 1005 at this point should still be arranged with their photosurfaces facing upwards. Optionally, since there exists a lower glass substrate 1102 in the display panel 1100, the glass substrate 1001 in the touch panel 1000 may be omitted, that is, the solar cell panel 1002 of the touch panel may be arranged directly at the lower side of the lower glass substrate 1102.

A further embodiment of the disclosure provides yet another touch display apparatus. This touch display apparatus may comprise a display panel, a processor and a touch panel. This embodiment differs from the previous ones in that the touch panel may be separate from the display panel, such as the touch pad that is arranged at the keyboard region of a laptop and that is separate from the display thereof.

In this embodiment, the processor may pre-store the correspondence between the display region of the display panel and the touch region of the touch panel. The touch panel determines a sliding path of the touch object according to the touch region of the touch object, and the processor draws the sliding path of the touch object on the display panel or accordingly performs control of the display object on the display panel, e.g. movement of the cursor.

Obviously, various modifications and variations can be made by the skilled in the art without departing from the spirit and scope of the present disclosure. Thus, if such modifications and variations are within the scope of the appended claims and the equivalents thereof, the present disclosure is intended to include these modifications and variations.

The invention claimed is:

1. A touch panel, comprising:
   a glass substrate;
   a solar cell panel located at a side of the glass substrate and comprising a plurality of solar cell modules, the plurality of solar cell modules being arranged in a grid having a plurality of rows aligned in a first direction and a plurality of columns aligned in a second direction;
   a plurality of sensing lines in the first direction and a plurality of sensing lines in the second direction for transmitting electric power generated by the solar cell modules of the solar cell panel;
   a detection unit for measuring the electric power transmitted by the sensing lines in the first and second directions; and
   a touch region of a touch object determined by the detection unit based on an electric characteristic measured by the detection unit;
   wherein each sensing line of the plurality of sensing lines in the first direction connects the individual solar cell modules in a row of solar cell modules in series;
   wherein each sensing line of the plurality of sensing lines in the second direction connects the individual solar cell modules in a column of solar cell modules in series;
   wherein the electric characteristic comprises at least one of a current measurement and a voltage measurement; and
   wherein a working light source is selected by the detection unit from the group consisting of an external light source and an internal light source based on the electric characteristic.

2. The touch panel of claim 1,
   wherein the external light source is selected as the working light source when the electric characteristic is greater than a first electric characteristic threshold and the internal light source is deactivated;
   wherein the internal light source is selected as the working light source when the electric characteristic is not greater than the first electric characteristic threshold and the internal light source is deactivated;
   wherein the external light source is selected as the working light source when the electric characteristic is greater than a second electric characteristic threshold and the internal light source is activated; and wherein the internal light source is selected as the working light source when the electric characteristic is not greater than the second electric characteristic threshold and the internal light source is activated.

3. The touch panel of claim 1,
wherein the touch region is defined by at least one sensing line in the first direction and at least one sensing line in the second direction each having a smaller electric characteristic when the internal light source is deactivated; and
wherein the touch region is defined by at least one sensing line in the first direction and at least one sensing line in the second direction each having a larger electric characteristic when the internal light source is activated.

4. The touch panel of claim 3,
wherein the smaller electric characteristic is defined by the at least one sensing line in the first direction and the at least one sensing line in the second direction each having an electric characteristic below a first predetermined characteristic threshold; and
wherein the larger electric characteristic is defined by the at least one sensing line in the first direction and the at least one sensing line in the second direction each having an electric characteristic above a second predetermined characteristic threshold.

5. The touch panel of claim 3,
wherein the smaller electric characteristic is defined by the at least one sensing line in the first direction and the at least one sensing line in the second direction each having an electric characteristic that decreases a first predetermined amount below an initial characteristic measurement; and
wherein the larger electric characteristic is defined by the at least one sensing line in the first direction and the at least one sensing line in the second direction each having an electric characteristic that increases a second predetermined amount above the initial characteristic measurement.

6. The touch panel of claim 3,
wherein the touch region is defined by the solar cell modules connected in series by only one sensing line in at least one of the first direction and second direction when only one sensing line in at least one of the first direction and the second direction has a smaller electric characteristic;
wherein the touch region is defined by the solar cell modules connected in series by only one sensing line in at least one of the first direction and second direction when only one sensing line in at least one of the first direction and the second direction has a larger electric characteristic.

7. A touch display apparatus comprising:
a display panel having a plurality of pixel electrodes; and
a touch panel, comprising:
a glass substrate;
a solar cell panel located at a side of the glass substrate and comprising a plurality of solar cell modules, the plurality of solar cell modules being arranged in a grid having a plurality of rows aligned in a first direction and a plurality of columns aligned in a second direction;
a plurality of sensing lines in the first direction and a plurality of sensing lines in the second direction for transmitting electric power generated by the solar cell modules of the solar cell panel;
a detection unit for measuring the electric power transmitted by the sensing lines in the first and second directions; and
a touch region of a touch object determined by the detection unit based on an electric characteristic measured by the detection unit;
wherein each sensing line of the plurality of sensing lines in the first direction connects the individual solar cell modules in a row of solar cell modules in series;
wherein each sensing line of the plurality of sensing lines in the second direction connects the individual solar cell modules in a column of solar cell modules in series;
wherein the electric characteristic comprises at least one of a current measurement and a voltage measurement;
wherein the plurality of solar cell modules of the touch panel are projected orthographically onto the pixel electrodes of the display panel; and
wherein a working light source is selected by the detection unit from the group consisting of an external light source and an internal light source based on the electric characteristic.

8. The touch display apparatus of claim 7, wherein the display panel further comprises a display pixel region and the touch panel is disposed proximate and above the display pixel region.

9. The touch display apparatus of claim 8, wherein the projection of each of the solar cell modules of the touch panel corresponds to the projection of at least one pixel electrode of the display panel, and the projection of each pixel electrode corresponds to the projection of only one solar cell module.

10. The touch display apparatus of claim 8, wherein the touch display apparatus further comprises an electric power storage device into which the electric power generated by the solar cell panel is transmitted by the touch panel via the sensing lines in the first direction and the sensing lines in the second direction.

11. The touch display apparatus of claim 10, wherein the touch panel transmits electric power directly to the display panel when the electric power storage device is in a full state.

12. The touch display apparatus of claim 7, wherein the display panel further comprises a backlight and the touch panel is disposed proximate and above the backlight.

13. The touch display apparatus of claim 12, wherein the projection of each of the solar cell modules of the touch panel corresponds to the projection of at least one pixel electrode of the display panel, and the projection of each pixel electrode corresponds to the projection of only one solar cell module.

14. The touch display apparatus of claim 12, wherein the touch display apparatus further comprises an electric power storage device into which the electric power generated by the solar cell panel is transmitted by the touch panel via the sensing lines in the first direction and the sensing lines in the second direction.

15. The touch display apparatus of claim 14, wherein the touch panel transmits electric power directly to the display panel when the electric power storage device is in a full state.

16. The touch display apparatus of claim 7, wherein the display panel further comprises an upper glass substrate and a lower glass substrate.

17. A touch display apparatus comprising:
a display panel,
a processor; and
a touch panel, comprising:

a glass substrate;

a solar cell panel located at a side of the glass substrate and comprising a plurality of solar cell modules, the plurality of solar cell modules being arranged in a grid having a plurality of rows aligned in a first direction and a plurality of columns aligned in a second direction;

a plurality of sensing lines in the first direction and a plurality of sensing lines in the second direction for transmitting electric power generated by the solar cell modules of the solar cell panel;

a detection unit for measuring the electric power transmitted by the sensing lines in the first and second directions; and a touch region of a touch object determined by the detection unit based on an electric characteristic measured by the detection unit;

wherein each sensing line of the plurality of sensing lines in the first direction connects the individual solar cell modules in a row of solar cell modules in series;

wherein each sensing line of the plurality of sensing lines in the second direction connects the individual solar cell modules in a column of solar cell modules in series;

wherein the electric characteristic comprises at least one of a current measurement and a voltage measurement;

wherein the display panel is separate from the touch panel, and the processor pre-stores a correspondence between a display region of the display panel and a touch region of the touch panel; and wherein a working light source is selected by the detection unit from the group consisting of an external light source and an internal light source based on the electric characteristic.

* * * * *